United States Patent
Huang et al.

(10) Patent No.: US 6,567,028 B2
(45) Date of Patent: May 20, 2003

(54) REFERENCE VOLTAGE STABILIZATION IN CMOS SENSORS

(75) Inventors: Steve Huang, Arcadia, CA (US); Daniel Van Blerkom, Altadena, CA (US); Sandor L. Barna, Pasadena, CA (US); Giuseppe Rossi, Pasadena, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/976,843

(22) Filed: Oct. 12, 2001

(65) Prior Publication Data

US 2003/0071748 A1 Apr. 17, 2003

(51) Int. Cl.$^7$ ................................................. H03M 1/12
(52) U.S. Cl. ........................ 341/155; 341/164; 341/172; 250/208.1; 250/330
(58) Field of Search ................................ 341/122, 155, 341/156, 161, 172; 250/208.1, 214 A

(56) References Cited

U.S. PATENT DOCUMENTS

| | | | |
|---|---|---|---|
| 5,668,500 A | * | 9/1997 | LeFevre ..................... 250/330 |
| 5,886,353 A | * | 3/1999 | Spivey et al. ............. 250/208.1 |
| 6,002,157 A | * | 12/1999 | Kozuka .................... 250/338.4 |
| 6,037,577 A | * | 3/2000 | Tanaka et al. ........... 250/208.1 |
| 6,091,280 A | * | 7/2000 | Hynecek ................... 250/208.1 |
| 6,181,269 B1 | * | 1/2001 | Nishiuchi et al. ........... 341/155 |
| 6,184,516 B1 | * | 2/2001 | Sawada et al. .......... 250/208.1 |
| 6,249,240 B1 | * | 6/2001 | Bellaouar .................... 341/155 |
| 6,424,375 B1 | * | 7/2002 | Fowler .................. 250/214 R |
| 2001/0040548 A1 | * | 11/2001 | Ikeda ........................... 345/92 |

* cited by examiner

Primary Examiner—Michael Tokar
Assistant Examiner—Lam T. Mai
(74) Attorney, Agent, or Firm—Dickstein Shapiro Morin & Oshinsky LLP

(57) ABSTRACT

A reference voltage generator for use in an image sensor provides a reference voltage to an S/H block during a pixel read-out operation and another reference voltage to an analog-to-digital converter (ADC) during a digitization operation. The reference voltage generator includes a variable voltage generator, a sample-and-hold circuit to sample a reference voltage prior to the pixel read-out operation or the digitization operation, and a buffer amplifier to drive the appropriate reference voltage to the relatively high impedance load presented by the S/H block and the variable impedance load provided by the ADC.

22 Claims, 4 Drawing Sheets

REFERENCE VOLTAGE STABILIZATION IN CMOS SENSORS

BACKGROUND

Active pixel sensor (APS) imaging devices are described in U.S. Pat. No. 5,471,515. These imaging devices include an array of pixel cells, arranged in rows and columns, that convert light energy into electric signals. Each pixel includes a photodetector and one or more active transistors. The transistors typically provide amplification, read-out control and reset control, in addition to producing the electric signal output from the cell. Providing amplification at each pixel may help to reduce noise and distortion levels.

Main sources of image sensor noise include fixed pattern noise (FPN) or temporal noise. FPN may manifest as a stationary background pattern in the image which is caused by mismatches in device parameters. Temporal noise is the temporal variation in pixel output values under uniform illumination due to device noise. Row-wise temporal noise (RTN) may manifest as stripes of different intensity in an image produced by an object with uniform intensity. Both FPN and RTN may be caused by voltage fluctuations in the sensor.

SUMMARY

A sensor includes a pixel array with pixels arranged in rows and columns. Analog signals produced by the pixels during an exposure are passed to a read-out chain. The read-out chain includes a sample-and-hold (S/H) block and an analog-to-digital converter (ADC). A reference voltage generator provides a reference voltage to capacitors in each of the S/H units in the S/H block (one per column) during a pixel read-out operation. The reference voltage generator provides another reference voltage to capacitors in the ADC during a digitization operation.

The reference voltage generator includes a variable voltage generator, e.g., a resistor ladder with a current source and multiple switches which may be selected in different numbers to generate different voltages. The reference voltage generator also includes a sample-and-hold circuit to sample a reference voltage prior to the pixel read-out operation or the digitization operation and a buffer amplifier to drive the appropriate reference voltage to the relatively high impedance load presented by the S/H block and the variable impedance load provided by the ADC.

DETAILED DESCRIPTION

Figure 1:
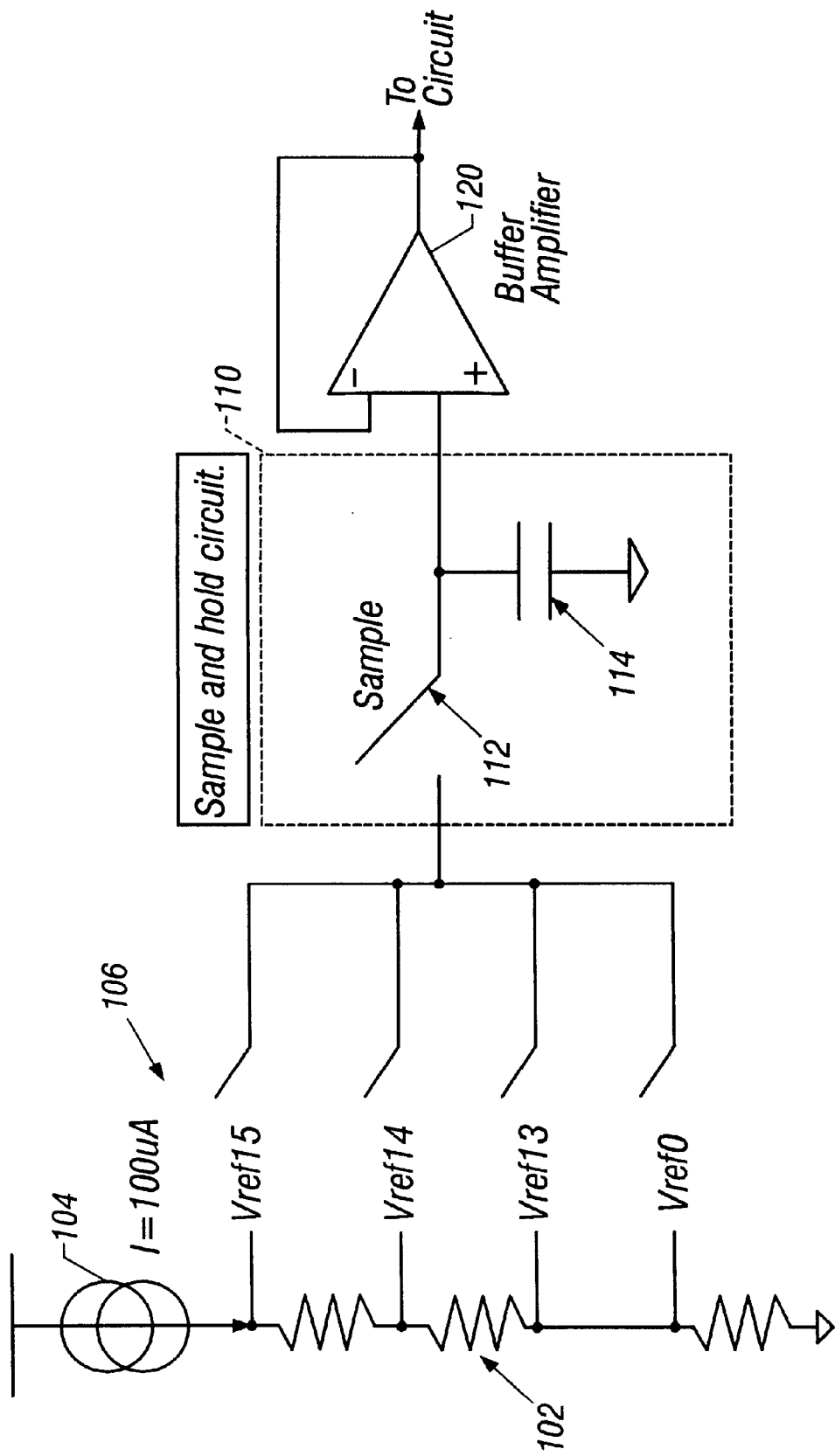
FIG. 1 is a schematic diagram of a reference voltage generator according to an embodiment.

FIG. 1 is a reference voltage generator 100 for use in a CMOS sensor according to an embodiment. The reference voltage generator may be used to generate stable reference voltages for different stages in a read-out chain of the CMOS sensor.

The reference voltage generator 100 includes a resistor ladder 102 with a current source 104, which provides, for example, a nominal current of about 100 $\mu$A. The resistor ladder 102 may be configured as a voltage divider and include a set of programmable switches 106 to select one of a number of available reference voltage values $V_{ref0}$–$V_{ref15}$. The selected reference voltage is passed to a sample-and-hold ("S/H") circuit 110. When selected, a sampling switch 112 samples the selected referenced voltage onto a holding capacitor 114. The sampled reference voltage is passed to a buffer amplifier 120 that amplifies the signal and passes the reference voltage to the appropriate stage of the read-out chain. The buffer amplifier 120 may be a voltage amplifier with unity gain. The buffer amplifier 120 acts as a voltage driver, and enables the reference voltage generator to provide a stable reference voltage with enough current to drive both high and low impedance loads.

Figure 2:
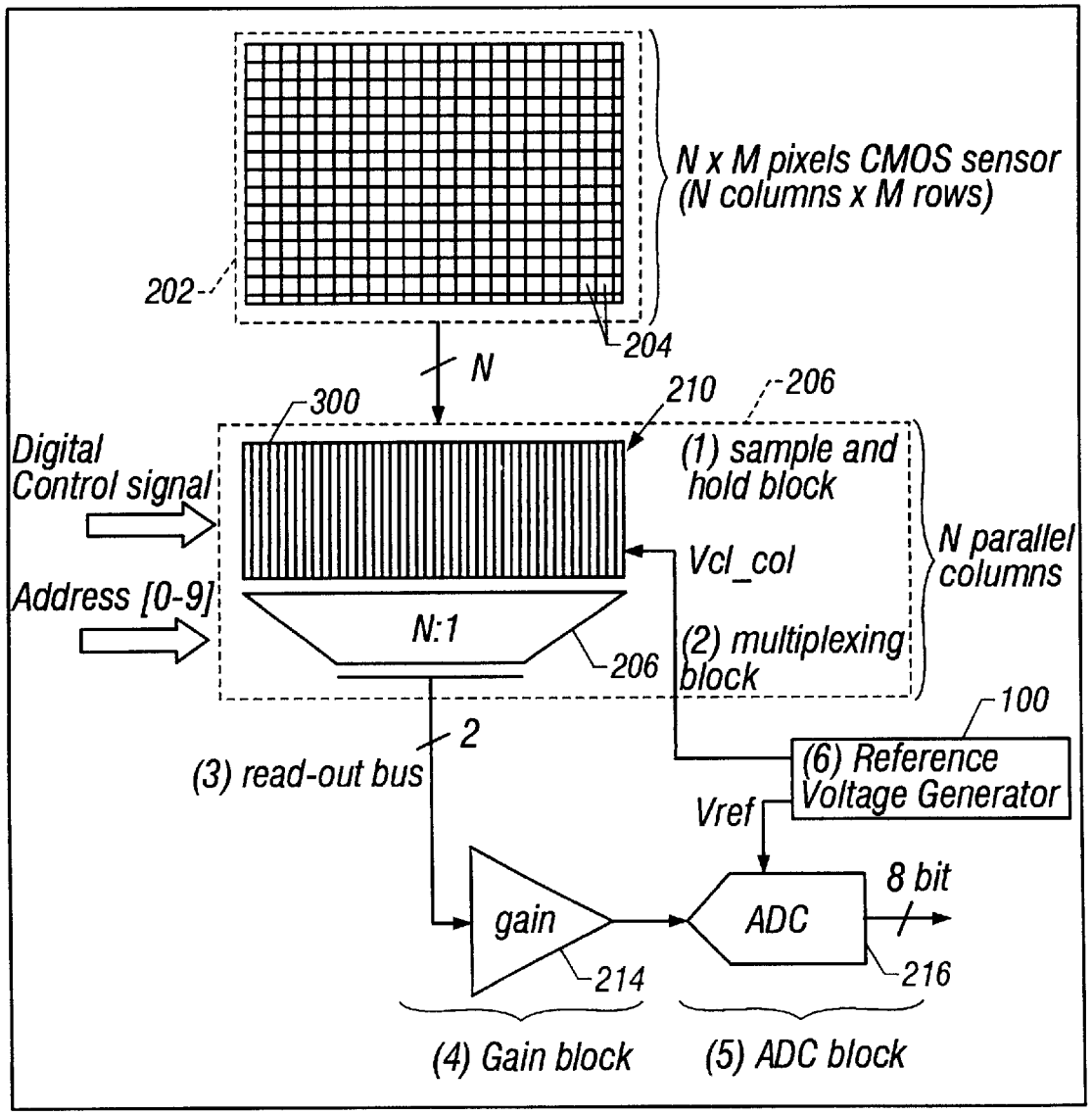
FIG. 2 is a block diagram of a sensor according to an embodiment.

FIG. 2 illustrates a CMOS sensor 200 including the reference voltage generator 100. The sensor 200 may be an active pixel sensor (APS), in which the pixel array 202 includes a grid of individually addressable pixels 204 arranged in rows and columns. Each pixel 204 includes a photodetector, such as a photogate, photodiode, or pinned photodiode. The photodetector converts light energy received in the form of photons into an electric charge. This electric charge corresponds to an amount of light that the pixel 204 receives during an exposure to an image. The amount of light received by each pixel in the array during exposure to the image is used by the sensor 200 to produce a corresponding digital image.

Analog signals generated by the pixels 204 are read out row-by-row to a read-out chain 206. The read-out chain includes a S/H block 210, a multiplexing block 212, a gain block 214, and an analog-to-digital converter ("ADC") block 216. The reference voltage generator 100 provides a reference voltage $V_{cl\_col}$ to the S/H block 210 and a reference voltage $V_{ref}$ the ADC block 216.

Figure 3A:
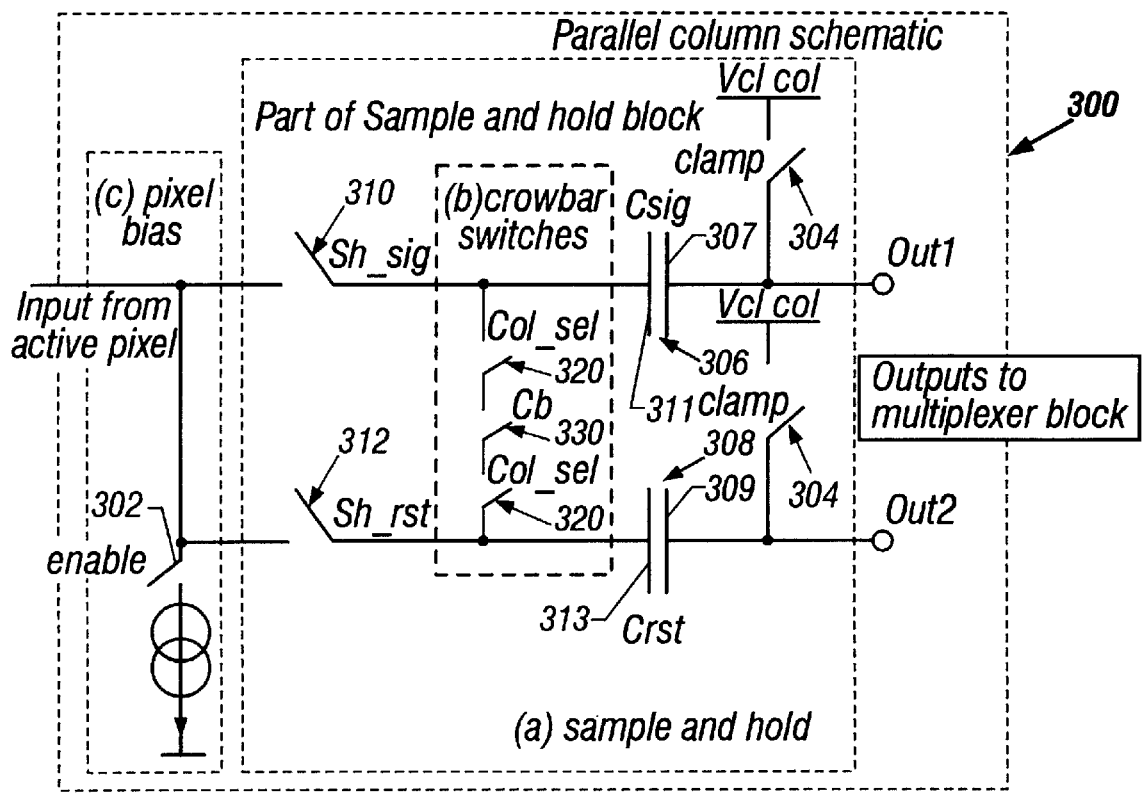
FIG. 3A is a schematic diagram of a sample-and-hold unit according to an embodiment.
Figure 3B:
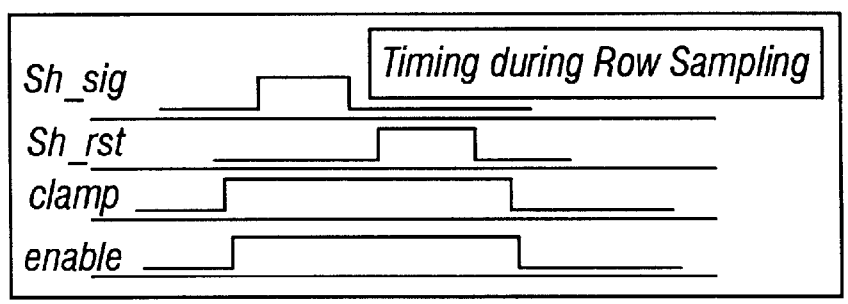
FIG. 3B is a timing signal diagram for signals in the sample-and-hold unit during a sampling operation according to an embodiment.

The S/H block 210 includes a number of S/H units 300, one for each column in the pixel array 202. The S/H units 300 may have a column parallel architecture, as shown in FIG. 3A. FIG. 3B illustrates the timing signals for switches in the S/H unit 300 during a row read-out operation. When the row is selected, the enable switch 302 and clamp switches 304 are closed substantially simultaneously. This clamps the back plates 307, 309 of a signal capacitor 306 and a reset capacitor 308 to a reference voltage $V_{cl\_col}$ supplied by the reference voltage generator 100. The reference voltage $V_{cl\_col}$ is selected from the resistor ladder 102 using the programmable switches 106 and is sampled onto the capacitor 114 in the S/H circuit 100 prior to the row read-out operation. The buffer amplifier 120 drives the sampled reference voltage $V_{cl\_col}$ to the load presented by the S/H units 300 in the S/H block 210.

The signal on the pixel in the column is sampled through Sh_sig switch 310 onto the signal capacitor 306 in the first portion of a row sampling period. After the capacitor is charged to the proper voltage, the photosensitive element in the pixel is reset. The reset level of the pixel is sampled through Sh_rst switch 312 during a second portion of the row sampling period.

During column read-out of the S/H block 210, the S/H units are read out sequentially. When the S/H unit 300 is selected, the column select switches 320 and crowbar switch 330 are closed. This shorts the front plates 311, 313 of the signal capacitor 306 and the reset capacitor 308, respectively, driving the respective charges on these capacitors out to the multiplexer block 212.

Each of the signal and reset capacitors may be relatively small, e.g., about 1 pF. However, during the row sampling operation, the reference voltage generator 100 must provide the clamping voltage $V_{cl\_col}$ to all of the S/H units 300 in the S/H block 210 simultaneously. This presents a relatively large load. For example, in a Common Image Format (CIF)-size sensor with 352H×288V pixel array with 1 pF capacitors, the load exceeds 350 pF. The buffer amplifier 120 provides enough current to drive each of the signal and reset capacitors in the S/H block to the appropriate reset voltage.

Sampling the reference voltage $V_{cl\_col}$ prior to each row read-out operation and reliably providing the sampled reference voltage to each S/H unit 300 ensures that the sampled signal and reset values for each pixel in the row are clamped to the same voltage value. This may substantially reduce fixed pattern noise (FPN), which may be caused by mismatched reference voltages in the S/H block 210.

Figure 4:
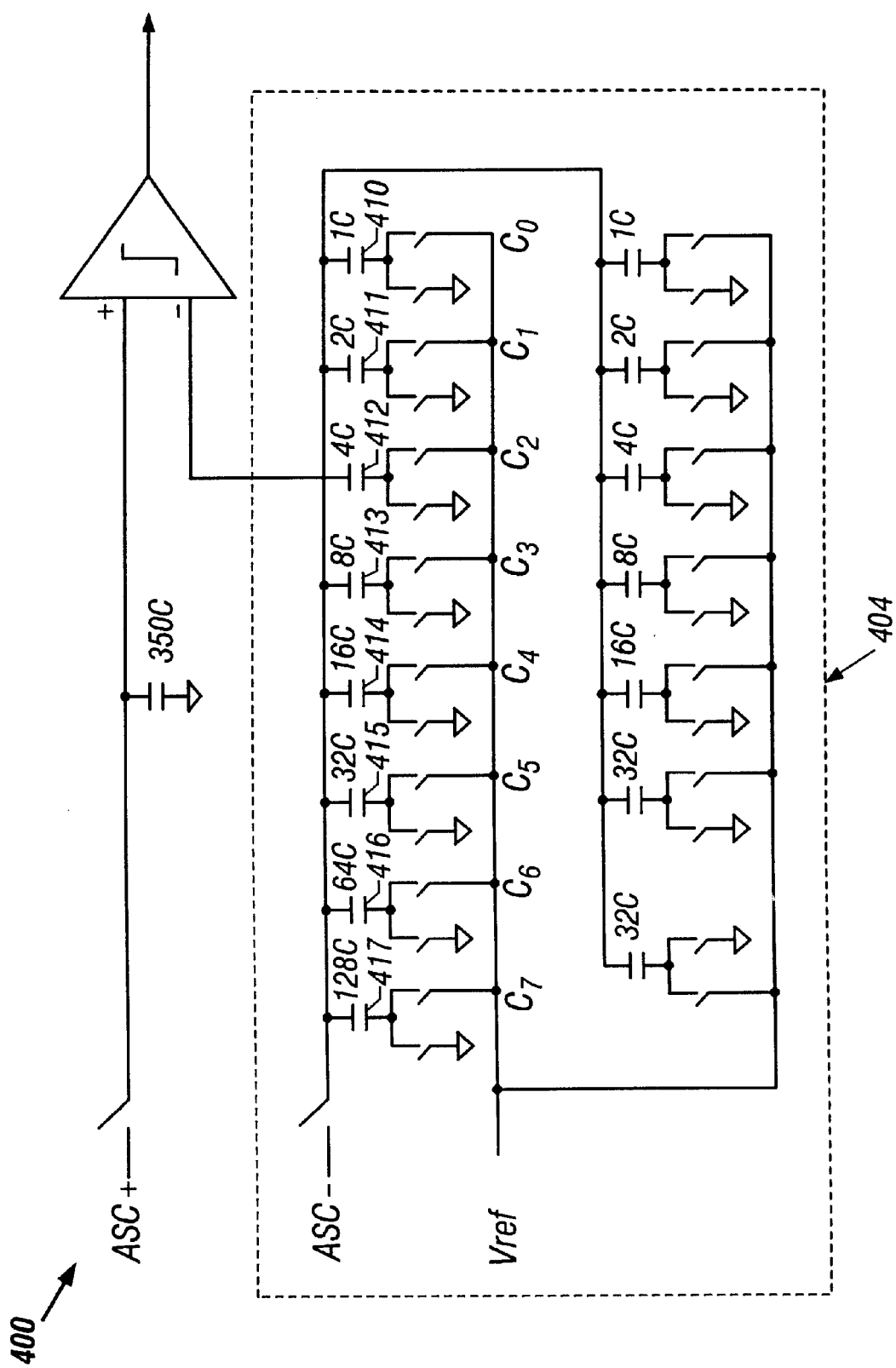
FIG. 4 is a schematic diagram of an analog-to-digital converter (ADC) according to an embodiment.

The reference voltage generator 100 also provides a reference voltage to the ADC block 216 prior to row digitization. In a row digitization operation, the sampled analog signal values read out from pixels in a row are converted into digital values. The ADC block 216 may include an 8-bit successive approximation ADC 400, as shown in FIG. 4. The ADC 400 includes a comparator 402 that compares the analog signal ASC+ and a digital signal from a digital-to-analog converter (DAC) 404. The DAC 404 includes an array of binary weighted capacitors $C_0$–$C_7$ 410–417 and two inputs including an analog signal ASC− and the reference voltage $V_{ref}$, respectively. The ADC 400 generates an 8-bit digital signal in a sequence of successive approximations.

The reference voltage $V_{ref}$ is selected from the resistor ladder 102 using the programmable switches 106 and is sampled onto the capacitor 114 in the S/H circuit 100 prior to the row digitization operation. The buffer amplifier 120 drives the sampled reference voltage $V_{ref}$ to the load presented by the ADC 400 in the ADC block 216.

The number of capacitors 410–417 coupled to the $V_{ref}$ node 405 changes depending on the size of the analog signal sampled from a pixel. Thus, the load on the reference voltage generator 100 varies during the analog-to-digital conversion in the row digitization process. To reduce noise, all pixel digitization should have the same $V_{ref}$. The voltage buffer amplifier 120 provides the same sampled reference voltage $V_{ref}$ to the ADC despite the variations in the loads for different analog pixel signals.

Sampling the reference voltage $V_{ref}$ prior to each row digitization operation and driving the sampled reference voltage $V_{ref}$ with the buffer amplifier 120 may enhance the stability of the reference voltage provided to the ADC 400 for each pixel digitization. This may reduce any noise disturbances coupled into the ADC 400 due to variations in the reference voltage $V_{ref}$ during digitization of different signals since all pixel digitizations within each row are reliably provided with the same reference voltage. This may be particularly useful when the ADC 216 includes multiple ADCs for digitization of the pixel signals from the same row.

A number of embodiments have been described. Nevertheless, it will be understood that various modifications may be made without departing from the spirit and scope of the invention. Accordingly, other embodiments are within the scope of the following claims.

What is claimed is:

1. A method comprising:
   generating a reference voltage;
   sampling the reference voltage; and
   driving the sampled reference voltage to a load in a pixel read-out chain with a buffer amplifier.

2. The method of claim 1, wherein the buffer amplifier comprises a voltage amplifier with unity gain.

3. The method of claim 1, wherein the load comprises a plurality of capacitors in a sample-and-hold block of an image sensor.

4. The method of claim 1, wherein the load has an impedance greater than about 300 pF.

5. The method of claim 1, wherein the load comprises a plurality of capacitors in an analog-to-digital converter (ADC).

6. The method of claim 1, wherein the load has a variable impedance.

7. The method of claim 6, wherein the impedance varies in a range include a first value below about 10 pF and a second value above about 100 pF.

8. Apparatus comprising:
   a voltage generator operative to generate a first reference voltage for a pixel read-out operation and to generate a second reference voltage for an analog-to-digital conversion operation;
   a sample-and-hold circuit coupled to the voltage generator and operative to sample-and-hold the first reference voltage prior to the pixel read-out operation and to sample and hold the second reference voltage prior to the analog-to-digital conversion operation; and
   a buffer amplifier coupled to the sample-and-hold circuit and operative to amplify a sampled reference voltage.

9. The apparatus of claim 8, wherein the buffer amplifier comprises a voltage amplifier.

10. The apparatus of claim 9, wherein the voltage amplifier has unity gain.

11. The apparatus of claim 8, wherein the buffer amplifier is operative to drive said sampled reference voltage to a load in a pixel read-out chain of an image sensor.

12. The apparatus of claim 8, wherein the voltage generator comprises a resistance ladder coupled to a current source, said resistance ladder including a plurality of resistors coupled to a plurality of selection switches.

13. The apparatus of claim 8, wherein a load of said buffer amplifier comprises a plurality of capacitors in a sample-and-hold block of an image sensor.

14. The apparatus of claim 8, wherein a load of said buffer amplifier has an impedance greater than about 300 pF.

15. The apparatus of claim 8, wherein a load of said buffer amplifier comprises a plurality of capacitors in an analog-to-digital converter (ADC).

16. The apparatus of claim 8, wherein a load of said buffer amplifier has a variable impedance.

17. The apparatus of claim 16, wherein the impedance varies in a range include a first value below about 10 pF and a second value above about 100 pF.

18. A sensor comprising:
   a pixel array including a plurality of pixels;
   a sample-and-hold block operative to receive signals from the pixel array, said sample-and-hold block including a plurality of capacitors and a plurality of switches operatively coupling said plurality of capacitors to a first reference voltage;
   an analog-to-digital converter (ADC) operative to receive signals from said sample-and-hold block, said ADC including a plurality of capacitors and a plurality of switches, operatively coupling said plurality of capacitors to a second reference voltage; and a voltage generator operative to generate the first reference voltage and the second reference voltage, said voltage generator including a sample-and-hold circuit operative to sample-and-hold the first reference voltage prior to a pixel read-out operation and to sample and hold the second reference voltage prior to an analog-to-digital conversion operation; and a buffer amplifier coupled to the sample-and-hold circuit and operative to amplify a sampled reference voltage.

19. The sensor of claim 18, wherein the buffer amplifier is operative to drive the first reference voltage to the plurality of capacitors in the sample-and-hold block during the pixel read-out operation and to drive the second reference voltage to the plurality of capacitors in the analog-to-digital conversion operation.

20. The sensor of claim 18, wherein the buffer amplifier comprises a voltage amplifier.

21. The sensor of claim 20, wherein the voltage amplifier has unity gain.

22. The sensor of claim 18, wherein the sensor is an active pixel sensor (APS).

* * * * *